(12) United States Patent
Hendrickson et al.

(10) Patent No.: US 8,180,774 B2
(45) Date of Patent: May 15, 2012

(54) WEB-SCALE DATA PROCESSING SYSTEM AND METHOD

(75) Inventors: Benjamin Cappel Hendrickson, Bellevue, WA (US); Nicholas Stefan Gerner, Redmond, WA (US)

(73) Assignee: SEOmoz, Inc., Seattle, WA (US)

( * ) Notice: Subject to any disclaimer, the term of this patent is extended or adjusted under 35 U.S.C. 154(b) by 460 days.

(21) Appl. No.: 12/572,989

(22) Filed: Oct. 2, 2009

(65) Prior Publication Data

US 2010/0088352 A1 Apr. 8, 2010

Related U.S. Application Data

(60) Provisional application No. 61/102,785, filed on Oct. 3, 2008, provisional application No. 61/102,775, filed on Oct. 3, 2008.

(51) Int. Cl.
*G06F 17/30* (2006.01)

(52) U.S. Cl. ........ 707/737; 707/752; 707/758; 707/802; 707/808

(58) Field of Classification Search .................. 707/703, 707/737, 752, 758, 769, 802, 803, 808
See application file for complete search history.

(56) References Cited

U.S. PATENT DOCUMENTS

| | | | | |
|---|---|---|---|---|
| 7,778,963 B2* | 8/2010 | Novik et al. | .................. | 707/610 |
| 7,779,001 B2* | 8/2010 | Zeng et al. | .................... | 707/726 |
| 7,965,207 B2* | 6/2011 | Hendrickson | ................... | 341/67 |
| 8,055,668 B2* | 11/2011 | Pomroy et al. | ................. | 707/757 |
| 8,060,580 B2* | 11/2011 | Hendrickson et al. | ........ | 709/217 |
| 2001/0000536 A1* | 4/2001 | Tarin | .............................. | 707/102 |
| 2004/0117479 A1* | 6/2004 | Jellum et al. | .................. | 709/224 |
| 2006/0235841 A1* | 10/2006 | Betz et al. | ......................... | 707/5 |
| 2007/0016579 A1* | 1/2007 | Kaul et al. | ......................... | 707/5 |
| 2008/0059412 A1* | 3/2008 | Tarin | ................................ | 707/2 |
| 2008/0235250 A1* | 9/2008 | Tarin | .............................. | 707/100 |
| 2008/0319939 A1* | 12/2008 | Tarin | ................................ | 707/1 |
| 2009/0037287 A1* | 2/2009 | Baitalmal et al. | ............. | 705/26 |
| 2009/0037337 A1* | 2/2009 | Baitalmal et al. | ............. | 705/59 |
| 2009/0037452 A1* | 2/2009 | Baitalmal et al. | ............ | 707/101 |
| 2009/0077078 A1* | 3/2009 | Uppala et al. | ..................... | 707/7 |
| 2009/0204631 A1* | 8/2009 | Pomroy et al. | ................. | 707/102 |
| 2010/0023513 A1* | 1/2010 | Berkhin et al. | ................... | 707/5 |
| 2010/0131584 A1* | 5/2010 | Johnson | ......................... | 709/203 |
| 2011/0066626 A1* | 3/2011 | Dharmalingam | ............. | 707/758 |
| 2011/0213775 A1* | 9/2011 | Franke et al. | ................. | 707/737 |

* cited by examiner

*Primary Examiner* — Charles Rones
*Assistant Examiner* — Rezwanul Mahmood
(74) *Attorney, Agent, or Firm* — AEON Law; Adam L. K. Philipp

(57) ABSTRACT

A system and method for obtaining and processing web-scale data are provided herein. More particularly, a web-scale data processing system and method for crawling, storing, processing, encoding, and/or serving web-scale data are disclosed.

21 Claims, 13 Drawing Sheets

WEB-SCALE DATA PROCESSING SYSTEM AND METHOD

CROSS REFERENCE TO RELATED APPLICATIONS

This application claims the benefit of priority to U.S. Provisional Application No. 61/102,785, filed Oct. 3, 2008, titled "WEB-SCALE DATA PROCESSING SYSTEM AND METHOD," naming inventors Benjamin Cappel Hendrickson and Nicholas Stefan Gerner. This application also claims the benefit of priority to U.S. Provisional Application No. 61/102,775, filed Oct. 3, 2008, titled "INDEX RANK OPTIMIZATION SYSTEM AND METHOD," naming inventors Benjamin Cappel Hendrickson, Nicholas Stefan Gerner, and S. Rand Mitchell Fishkin. This application is related to co-filed U.S. patent application entitled VARIABLE LENGTH INTEGER ENCODING SYSTEM AND METHOD, to Benjamin Cappel Hendrickson, having application Ser. No. 12/572,990. The above-cited applications are incorporated herein by reference in their entirety, for all purposes.

FIELD

The present disclosure relates to obtaining and processing web-scale data, and more particularly to systems and methods for crawling, storing, processing, encoding, and/or serving web-scale data.

BACKGROUND

The Internet is a worldwide, publicly accessible network of interconnected computer networks that transmit data by packet switching using the standard Internet Protocol (IP). The "network of networks" consists of millions of smaller domestic, academic, business, and government networks, which together enable various services, such as electronic mail, online chat, file transfer, and the interlinked web pages and other documents of the World Wide Web.

Web Links

The World Wide Web (commonly shortened to the Web) is a system of interlinked hypertext documents accessed via the Internet. With a Web browser, a user may view Web pages that may contain text, images, videos, and other multimedia. Most pertinently, a Web page may also contain hyperlinks or simply "links" that allow users to navigate from one page to another. A link is a reference or navigation element in a Web page or document that refers or "points" to a destination. The destination may be another location within the source page, or the destination may be a different page or a point within a different page.

Within a HyperText Markup Language (("HTML") document, links are typically specified using the <a> (anchor) elements. HTML code may specify some or all of the five main characteristics of a link:

link destination ("href" pointing to a Uniform Resource Locator ("URL"))
link label or "anchor text"
link title
link target
link class or link id For example, an HTML link specification may use the HTML element "a" with the attribute "href" and optionally also the attributes "title", "target", and "class" or "id":

<a href="URL" title="link title" target="link target" class="link class">anchor text</a>

Web Crawling

A vast amount of information is available via the Internet, taking the form of Web pages, images, and other types of files. At the present time, "search engines" offer one of the primary resources used by Internet users to locate information of interest. Due at least to the staggering number of pages on the Internet, search engines tend to operate largely algorithmically. Oversimplifying, search engines operate generally as follows. The search engine "crawls" the Web, storing data from pages it encounters on the search engine's own server or servers, where a second program, known as an indexer, extracts various information about the page, such as the words it contains and where these are located. The indexer may also extract information about links contained on the page.

In recent years, the Web has grown so large that creating such indexes involves so many resources that only very large, very well funded corporations have the resources to crawl and index the Web. Indeed, assuming that the average size of the HTML code of pages on the Web is roughly 25 kilobytes, then 3.9 billion pages (which is a small portion of what would be required to keep an up-to-date index of the Web) represent approximately 90 terabytes of data. Merely storing 90 terabytes of data, let alone processing it, would cost many thousands of dollars at today's bulk-storage rates. Processing such quantities of data is also typically difficult and expensive in part because the data sets tend to be too large to be stored and processed on a single modern-day computer in a timely fashion. Accordingly, crawling and indexing the Web has largely been the exclusive province of large, well-funded organizations.

Column-Oriented Database

Put simply, a column-oriented database management system (DBMS) stores its content by column rather than by row. DBMS systems are commonly used to store tabular data made up of rows and columns. The set of columns is often fixed by program design, while the number of rows is generally variable.

Many DBMS implementations are row-oriented in that they may store every attribute of a given row in sequence, with the last entry of one row followed by the first entry of the next. For example, row-oriented DBMS might store a set of data organized in the following manner:

[101, Smith, 40000], [102, Jones, 50000], [103, Johnson, 44000].

This set of data includes three rows and three columns. The first column is an incrementing ID (number) field; the second a name (text) field; the third, a salary (number) field. By contrast, a column-oriented implementation of a DBMS might organize the same set of data as follows:

[101, 102, 103]; [Smith, Jones, Johnson]; [40000, 50000, 44000].

Column data is of uniform type; therefore, there may be opportunities for storage optimizations in column oriented data that are not available in row oriented data. For example, many modern compression schemes, such as those derived from the LZ78 algorithm published by Lempel and Ziv in 1978, make use of the similarity of adjacent data to achieve compression. While the same techniques may be used on row-oriented data, a typical implementation will achieve less effective results.

Implicit Record IDs

A common practice, especially in row-oriented databases, is to assign an explicit unique record ID to each record. However, using explicit record IDs is not required—column-oriented or other databases may be used with implicit record IDs. In other words, the first entry in the column has an implicit ID of "1," the second entry has an implicit ID of "2," and so on. Problems may arise when data is segregated into two or more independent "epochs" whose internal record IDs collide with each other, and the data in the epochs must be unified into a consistent record ID space.

DESCRIPTION

Figure 1:
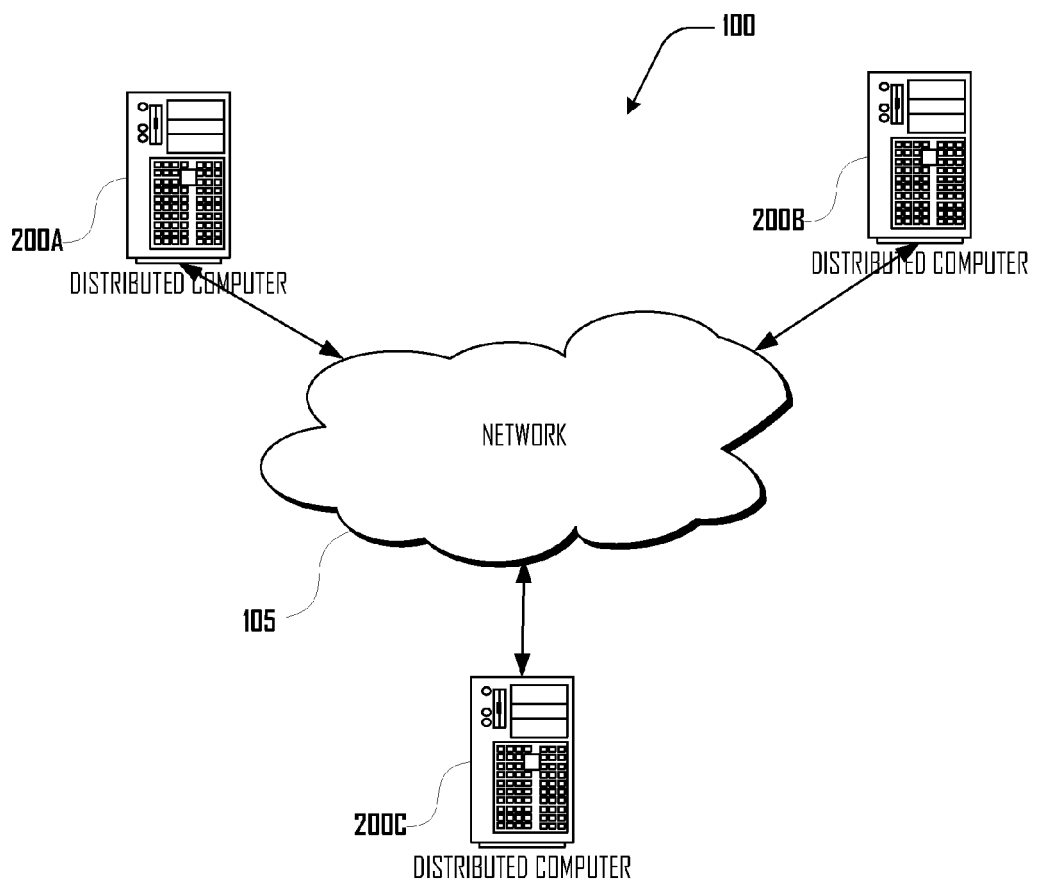
FIG. 1 is a system diagram of a number of devices in a network in accordance with one embodiment.

The detailed description that follows is represented largely in terms of processes and symbolic representations of operations by conventional computer components, including a processor, memory storage devices for the processor, connected display devices, and input devices. Furthermore, these processes and operations may utilize conventional computer components in a heterogeneous distributed computing environment, including remote file Servers, computer Servers and memory storage devices. Each of these conventional distributed computing components is accessible by the processor via a communication network.

Described herein are several processes and technologies to crawl, store, process, and serve web-scale data. Broadly speaking, an exemplary embodiment consists of a logical pipeline, beginning with a list of URLs to crawl. At the other end are final results ready for consumption by a user (or web front-end). The first step in the exemplary pipeline crawls URLs producing a large set of raw meta-data about those URLs, including many duplicates. These data may be stored on disk temporarily before being saved to stable storage (e.g. Amazon's S3). When crawling is complete, the whole dataset may be retrieved for various processing steps including duplication, elimination, and deeper link-analysis. Once processing is complete, the processed dataset is merged into any existing index data. The index may then be available for serving user queries where data is efficiently retrieved from disk and combined into answer sets.

In an exemplary embodiment, crawling methodology may decouple the output of fetching and parsing data from the input of the crawl. An exemplary crawler may begin with a large input set of URLs containing the complete set of URLs to crawl in the immediate future. These URLs may be assumed to contain no duplicates, and could be pre-filtered for Robots Exclusion Protocol (REP). In one embodiment, decoupling the input and output of the crawl by doing duplicate elimination and REP filtering before the crawl results in an O(n) cost for these requirements.

In an exemplary embodiment, a crawl may be distributed across several computing devices for scale. Each computing device may be responsible for retrieving a set of URLs. In some embodiments, URLs may be assigned to computing devices so that all URLs from a particular Pay Level Domain (PLD) (e.g. seomoz.org, or distilled.co.uk) are likely to be crawled by a single computing device (which helps to ensure politeness of crawling). PLDs may be mixed to promote a homogenous mix of URLs across computing devices. Each computing device may further mix URLs to increase domain diversity, which may improve throughput in the face of politeness considerations. In one embodiment, crawling is done in "epochs," with each epoch producing an internally, but not globally consistent namespace of URLs (so URL 32 from one epoch might be different than URL 32 from another). See, e.g., FIG. 4.

In one embodiment, a crawl focuses on page links rather than page content, so page content can be discarded immediately, although some content can be selectively saved if desired. Discarding some or all content may reduce the storage cost by an order of magnitude or more, while retaining high quality data (i.e. links) for internet marketing or other purposes. For example, if the average page size on the web were roughly 25 kilobytes, then 3.9 billion pages (a small portion of what may be required to keep an up-to-date index of the web) are approximately 90 terabytes of data, not including any other useful metadata. Assuming a compression ratio of 10:1, storing this data would require approximately 9 TB. Discarding most or all page content, while still keeping some amount of data about links (e.g., page titles and anchor texts) as well as other meta data, may reduce this requirement to approximately 2 TB.

Reference is now made in detail to the description of the embodiments as illustrated in the drawings. While embodiments are described in connection with the drawings and related descriptions, there is no intent to limit the scope to the embodiments disclosed herein. On the contrary, the intent is to cover all alternatives, modifications and equivalents. In alternate embodiments, additional devices, or combinations of illustrated devices, may be added to, or combined, without limiting the scope to the embodiments disclosed herein.

FIG. 1 illustrates a typical distributed computing environment. In alternate embodiments, more distributed computing devices 200 may be present. In other embodiments, only a single distributed computing device 200 may be present. In many embodiments, network 105 may be the Internet. In other embodiments, network 105 may be a local or wide area network, a private network, a virtual local area network, or other means of physically or logically connecting computers. In some embodiments, distributed computing devices 200 may be virtual machines, and/or they may be provided as part of a cloud or grid computing service. For example, in one embodiment, some or all distributed computing devices 200 may be virtual machines in the Amazon Elastic Compute Cloud ("EC2"), operated by Amazon.com, Inc. of Seattle Wash.

Figure 2:
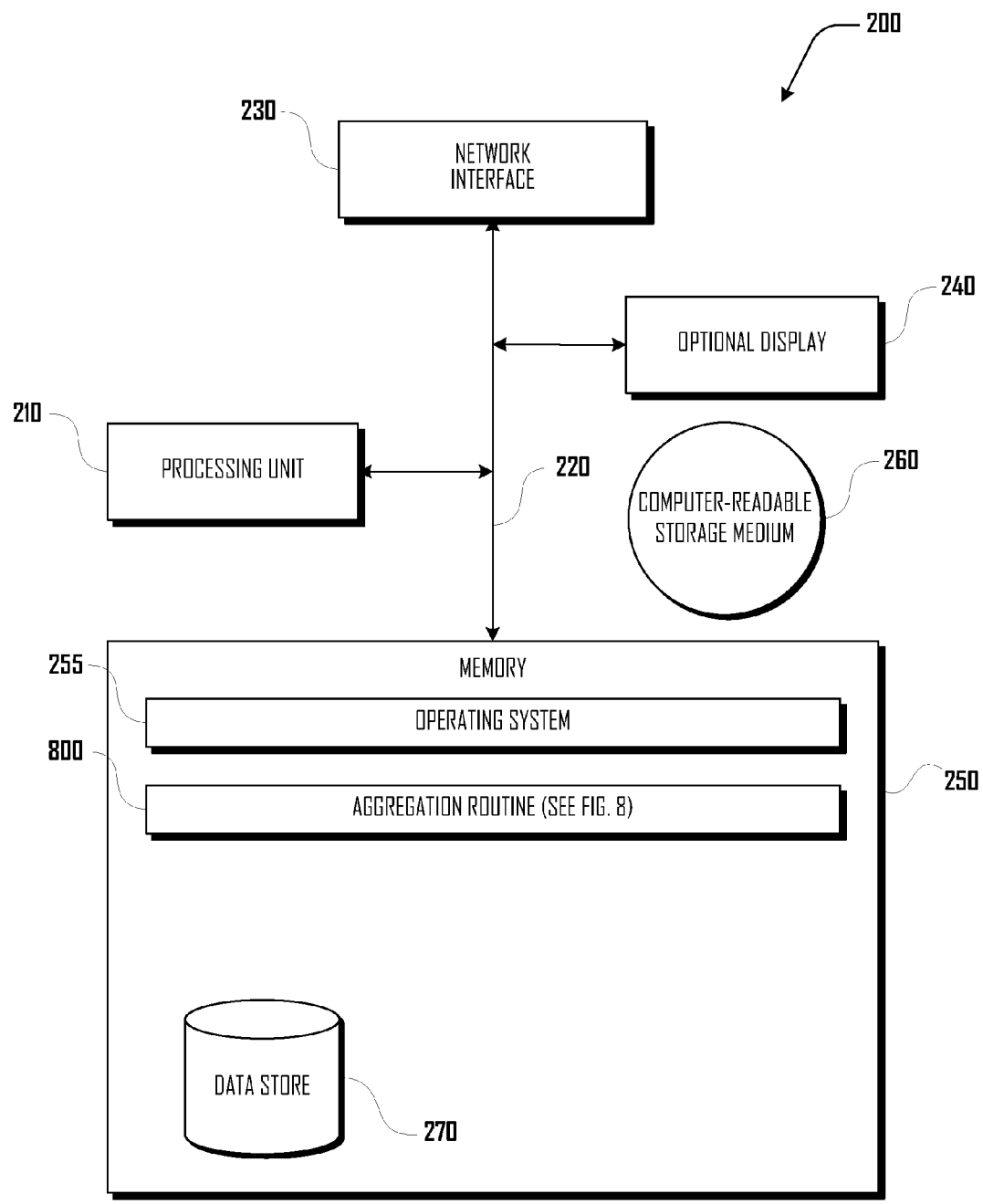
FIG. 2 is a diagram of components of a distributed computer in accordance with one embodiment.

FIG. 2 illustrates an exemplary distributed computing device 200. In some embodiments, a distributed computing device 200 may include many more components than those shown in FIG. 2. However, it is not necessary that all of these generally conventional components be shown in order to disclose an illustrative embodiment. As shown in FIG. 2, a distributed computing device 200 includes a network interface 230 for connecting to network 105. Network interface 230 includes the necessary circuitry for such a connection and is constructed for use with the appropriate protocol.

Distributed computing device 200 also includes a processing unit 210, a memory 250 and may include an optional display 240, all interconnected along with network interface 230 via a bus 220. Memory 250 generally comprises a random access memory ("RAM"), a read only memory ("ROM"), and a permanent mass storage device, such as a disk drive. The memory 250 stores program code for aggregation routine 800, as described herein.

In addition, memory 250 also stores an operating system 255. In various embodiments, these software components may be loaded from a computer readable storage medium into memory 250 of the distributed computing device 200 using a drive mechanism (not shown) associated with a computer readable storage medium 260 (such as a floppy disc, tape, DVD/CD-ROM drive, memory card, and the like), via the network interface 230, or via other like means. Some or all of the components described herein may be "virtual" components.

Memory 250 also includes a data store 270 to house some or all of the data structures as described below. In some embodiments, data store 270 may take the form of a conventional hard drive, an array of hard drives, or other accessible storage device or service. In some embodiments, data store 270 may comprise an online storage service, such as Amazon Simple Storage Service (S3), operated by Amazon.com, Inc. of Seattle Wash.

Figure 3:
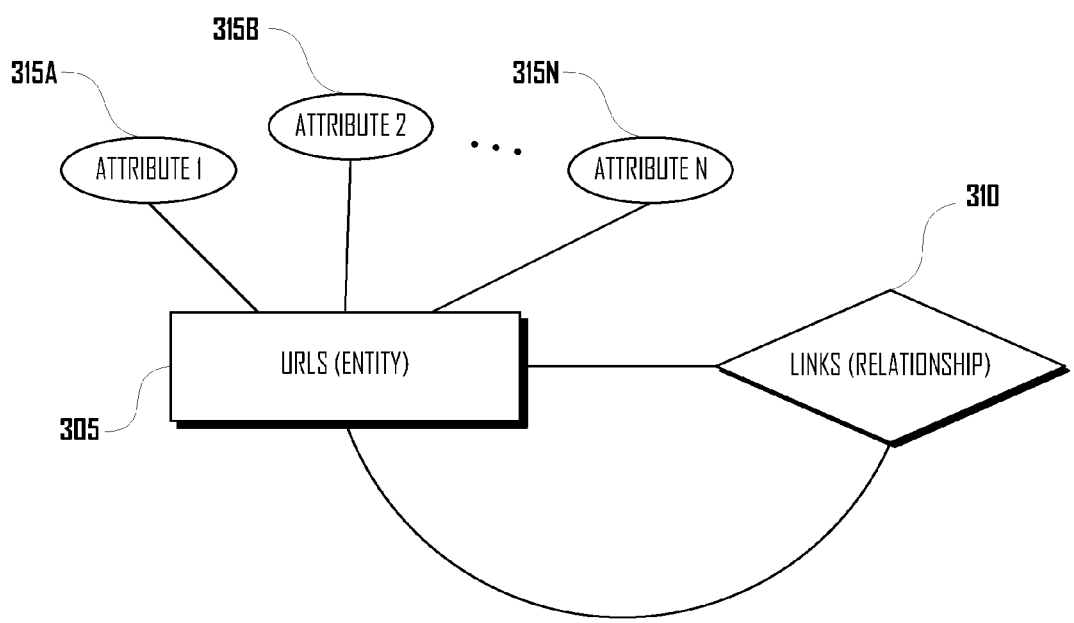
FIG. 3 is a diagram of an exemplary data structure in accordance with one embodiment.

In an exemplary embodiment, one or more distributed computing devices 200 may be used to "crawl" or index links on the World Wide Web. FIG. 3 illustrates an exemplary data structure that may be operated on by the routines described herein. As used herein, the term "column" refers to a distinct set of data. Although an exemplary embodiment is implemented using a column-oriented database, the processes disclosed herein are applicable regardless of the particular architecture used to store the data. In one embodiment, a data structure may comprise a column of URLs 305 or other entities, a column of links 310 or other relationships between entities, and zero or more columns of attributes 315. In one embodiment, attributes columns may include information about URLs, such as page sizes, page titles, other metadata, and the like. In some embodiments, links 310 may also have one or more attributes (e.g., anchor text, surrounding text, and the like).

Figure 4:
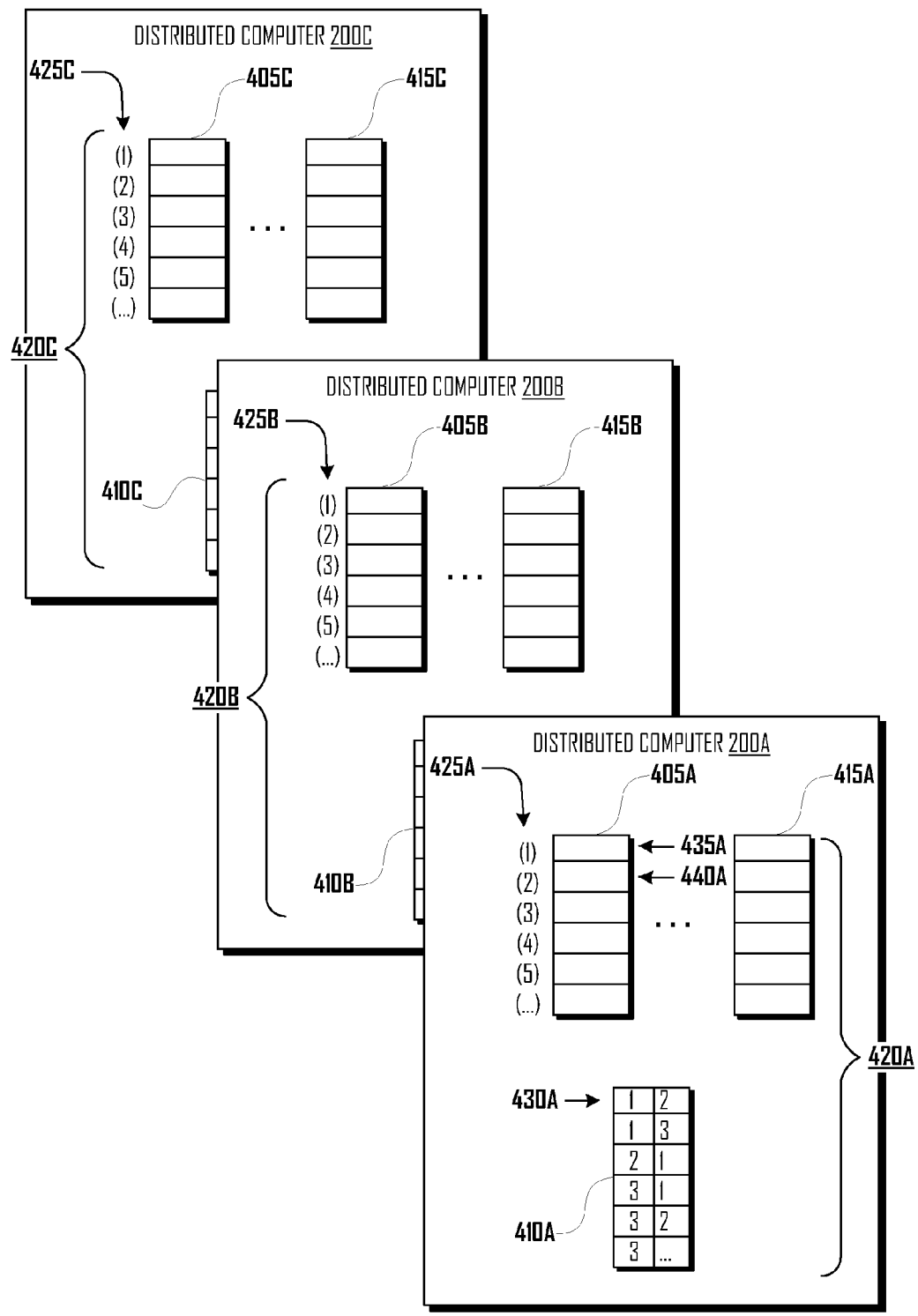
FIG. 4 is a diagram of an exemplary set of data tables in accordance with one embodiment.

At the present time, indexing the number of URLs (i.e., pages or link destination) on the web may exceed the storage and processing capacity of most or all readily-available individual computing devices. Accordingly, in an exemplary embodiment, an indexing task may be divided up into a number of manageable-sized chunks, with one distributed computing device 200 being responsible for each chunk. As a result, as illustrated in FIG. 4, each distributed computing device may construct its own group of columns of data, referred to as an "epoch." In one embodiment, an epoch is sized to fit into the memory available on a single distributed computing device 200. Generally speaking, each epoch will have an internally-consistent namespace, but different epochs are likely to have collisions within their respective namespaces. For example, epoch 420A includes columns of data 405A, 410A, 415A gathered by distributed computing device 200A. Each record in each column in epoch 420A has a record ID ("RID") 425A. In one embodiment, RIDs 425 are implicit or capable of being inferred from a record's position within a column (e.g., the 32nd integer in an integer column has RID 32). In other embodiments, RIDs 425 may be explicitly assigned. Either way, RIDs are consistent within each epoch.

In one embodiment, column 405A may represent a set of entity or URL data 305; column 410A may represent link data 310; and column 415A may represent attribute data 315. In other embodiments, there may be more, fewer, and/or different columns of data. Records in the link column 410 may comprise RIDs corresponding to entries in another column. For example, the first record 430A in link column 410A may indicate that a page corresponding to record "1" 435A in URL column 405A includes a link to the URL at record "2" 440A in the URL column 405A.

Epochs 420B and 420C each include the same types of columns as epoch 420A. However, FIG. 4 illustrates that RIDs 425B and 425C collide or overlap with RIDs 425A. In other words, although each epoch has an internally-consistent namespace, the different epochs have namespaces that collide with at least some other epochs. The colliding namespaces may be a problem when data from different epochs is merged or aggregated together.

Figure 5:
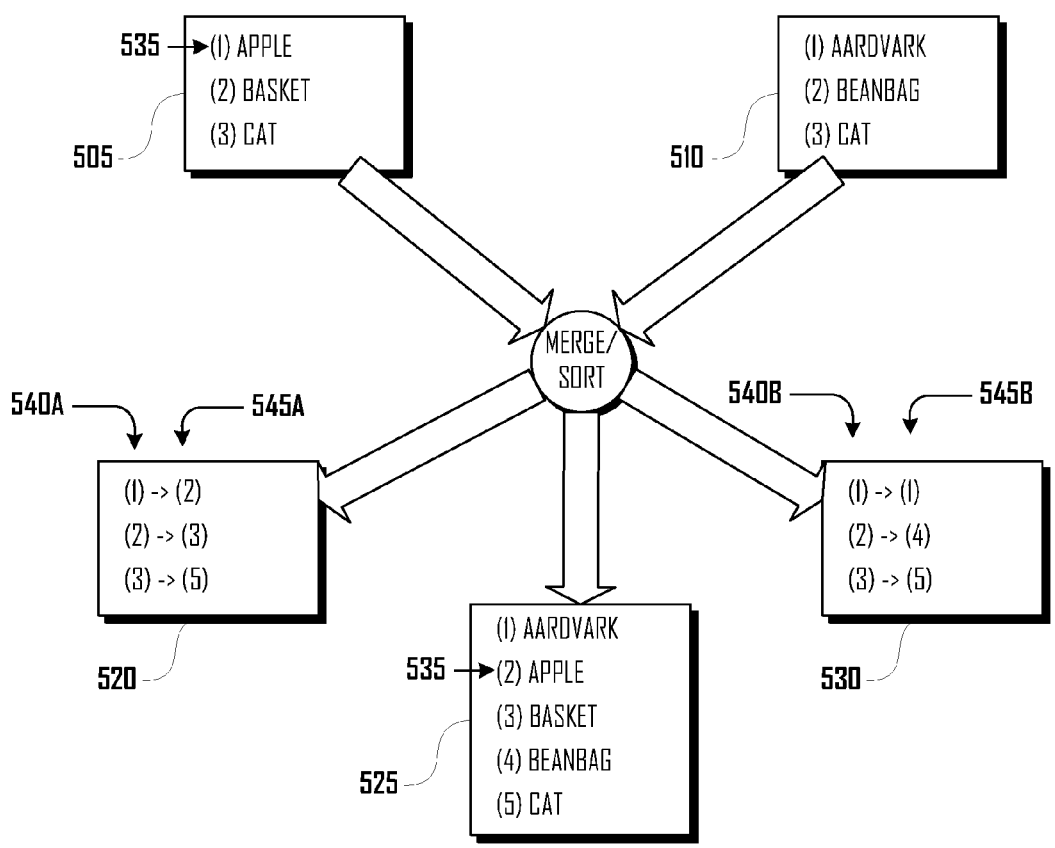
FIG. 5 is a diagram of an exemplary merge process and associated breadcrumbs in accordance with one embodiment.

FIG. 5 illustrates an exemplary merge of one column from two epochs with colliding namespaces. Column 505 (from epoch A) includes three records with RIDs of 1-3. Column 510 (from epoch B) also includes three records with RIDs of 1-3. When columns 505 and 510, from two epochs, are merged into a merged column 525, RIDs in the merged column 525 may differ from those in the original columns. For example, record "1" 535 in column 505 became record "2" 535 in the merged column 525.

As part of the merge process, translation tables 520 and 530 are created. Translation tables associate RIDs 540A-B from a source namespace with RIDs 545A-B in a destination namespace. In the illustrated example, translation table 520 associates RIDs 540A from column 505 with RIDs 545A in merged column 525. Specifically, translation table 520 indicates that record "1" 535 in column 505 corresponds to record "2" 535 in merged column 525, record "2" in column 505 corresponds to record "3" in merged column 525, and so on. Translation table 530 indicates similar correspondences between records in column 510 and merged column 525.

Figure 6:
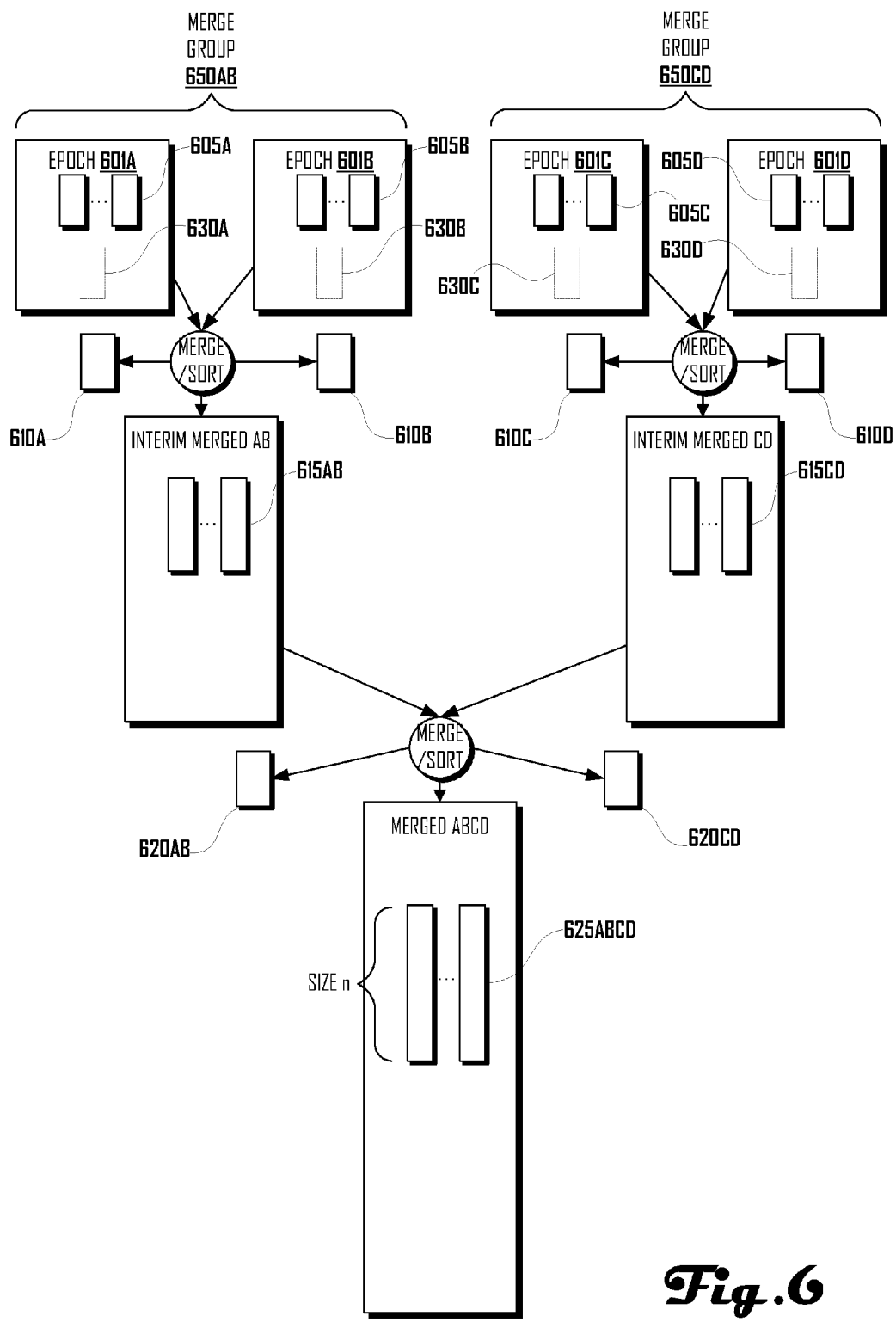
FIG. 6 is a diagram of an exemplary hierarchical data aggregation in accordance with one embodiment.

FIG. 6 illustrates a conceptual overview of an exemplary hierarchical aggregation process, including two levels of translation tables. (See also FIG. 9 and associated text.) Epochs 601A-D each include one or more columns comprising data 605A-D and one or more columns 630A-D comprising relationships between records in data columns 605A-D. RIDs in columns 630A-D, 605A-D within each epoch 601A-D are internally consistent, but collide with each other. In an exemplary embodiment, data columns 605A-D in each epoch 601A-D include an URL column and one or more attributes columns, and columns 630A-D contains links. In the illustrated example, epochs 601A-D are grouped into two merge groups, merge group 650AB including epochs 601A-B and merge group 650CD including epochs 601C-D. In other embodiments, there may be fewer or many more epochs, and merge groups may consist of more than two epochs.

In the illustrated example, merge group 650AB (comprising data columns 605A and 605B) is merged/sorted into a first interim set of data columns 615AB. Similarly, merge group 650CD (comprising data columns 605C and 605D) is merged/sorted into a second interim set of data columns 615CD. At this stage, link tables 630A-D are left alone, but translation tables 610A-D are created and stored during the merge/sort process. In the illustrated example, translation table 610A maps RIDs from original data columns 605A to RIDs in interim data columns 615AB. Translation tables 610B-D map RIDs from columns 605B-D to their respective interim data columns 615AB and 615CD. RIDs are internally consistent within interim data columns AB and interim data columns CD, but RIDs in the interim data columns collide with each other.

In the illustrated example, interim columns 615AB are further merged/sorted with columns 615CD, in a similar manner, to form a unified set of data columns 625ABCD, incorporating all data from epochs A-D into a global unified namespace. Translation tables 620AB and 620CD map RIDs from columns 615AB and 615CD, respectively, to RIDs in columns 625ABCD. Columns 625ABCD include N records, where N is less than or equal to the sum of the number of records in epochs A-D. In one embodiment, N is typically smaller than this sum because the individual epoch columns 605A-D may contain duplicates.

In the illustrated example, two merge/sort levels are depicted, but in other embodiments, there may be more or fewer merge/sort levels. After the operations depicted in FIG. 6, all data columns have been unified into a globally consistent namespace. However, link columns 630A-D have not been aggregated, and RIDs referenced in link columns 630A-D are not accurate with respect to the globally unified namespace.

Figure 7:
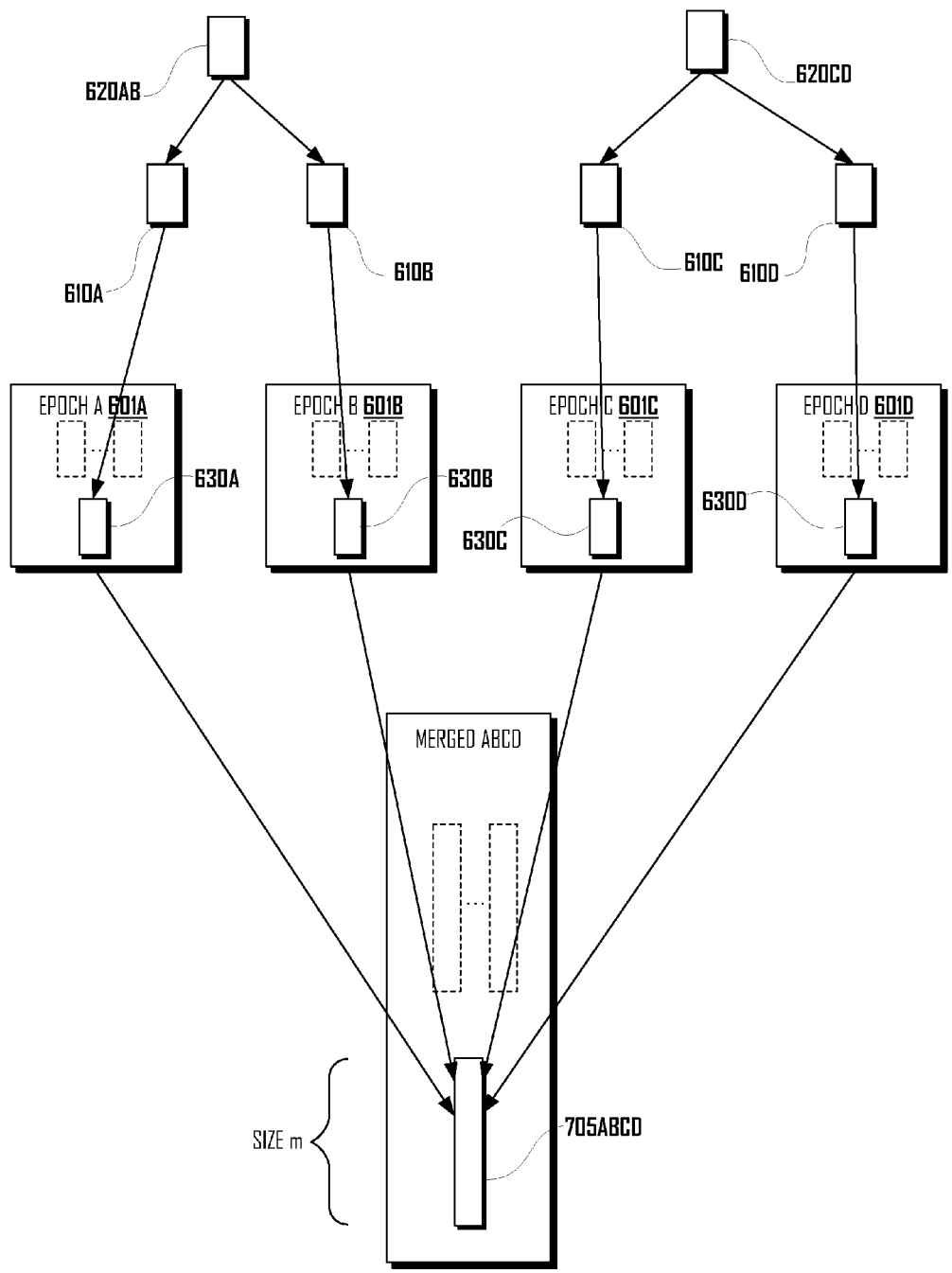
FIG. 7 is a flow diagram of an exemplary hierarchical links aggregation in accordance with one embodiment.

FIG. 7 illustrates an exemplary link columns aggregation. Translation tables 620AB and 620CD (created at the second level) are used to respectively translate destination RID references in translation tables 610A-D (created at the first level) into the global namespace. Unified translation tables 610A-D are then used to translate link columns 630A-D into the global unified namespace, after which a simple merge/sort operation creates a global unified link column 705ABCD having M entries. In an exemplary embodiment, M is greater than N, often much greater.

Figure 8:
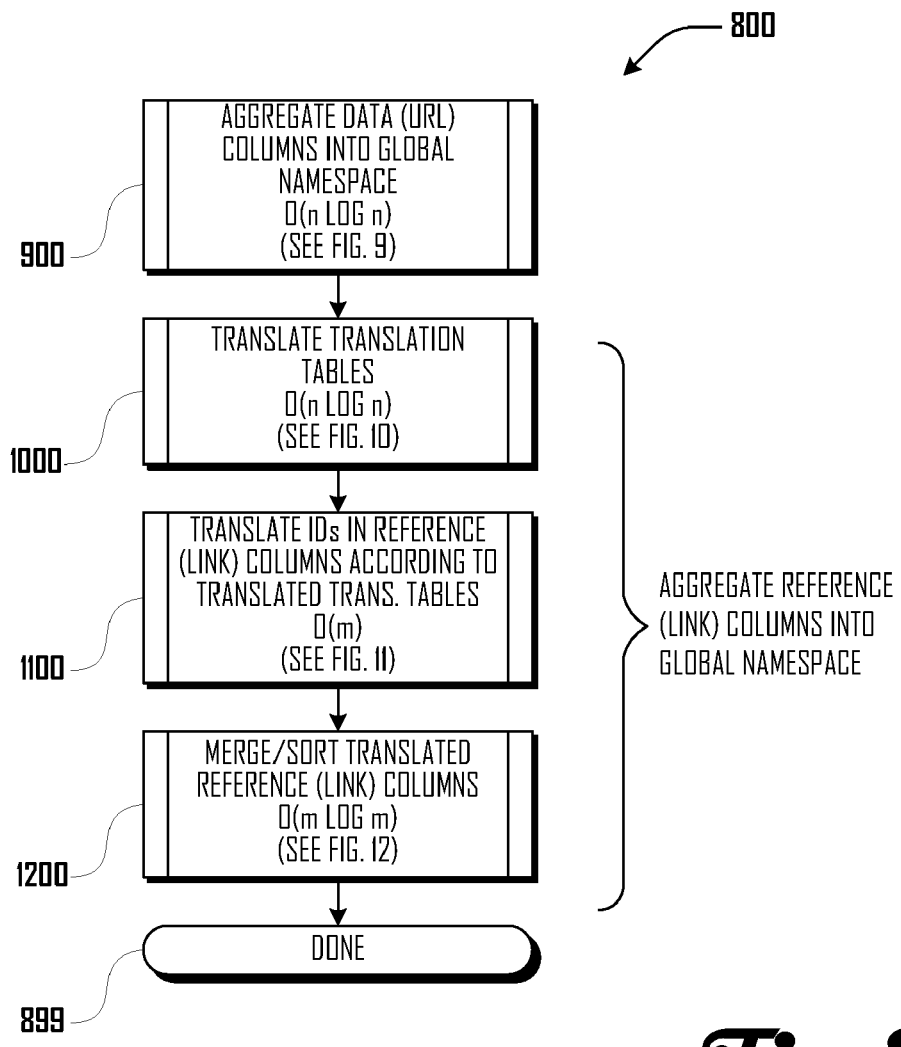
FIG. 8 is a flow diagram of an exemplary high level aggregation routine in accordance with one embodiment.

FIG. 8 illustrates an aggregation routine 800 for performing the operations discussed above in reference to FIG. 6-7. In subroutine 900, illustrated in FIG. 9 and discussed below, data columns (e.g., link and attribute columns) from separate epochs are aggregated into a unified global namespace and translation tables are created at each level. In an exemplary embodiment, the resources required to compute subroutine 900 scale according to O(n log n). In subroutine 1000, illustrated in FIG. 10 and discussed below, the translation tables created in subroutine 900 are translated into the global namespace. In an exemplary embodiment, the resources required to compute subroutine 1000 scale according to O(n log n). In subroutine 1100, illustrated in FIG. 11 and discussed below, link columns in separate epochs are translated into the global namespace. In an exemplary embodiment, the resources required to compute subroutine 1100 scale according to O(m). In subroutine 1200, the translated link columns from each epoch are cluster sorted and merged into a unified, consistent set of links. In an exemplary embodiment, the resources required to compute routine 805 scale according to O(m log m). Routine 800 ends at step 899.

Figure 9:
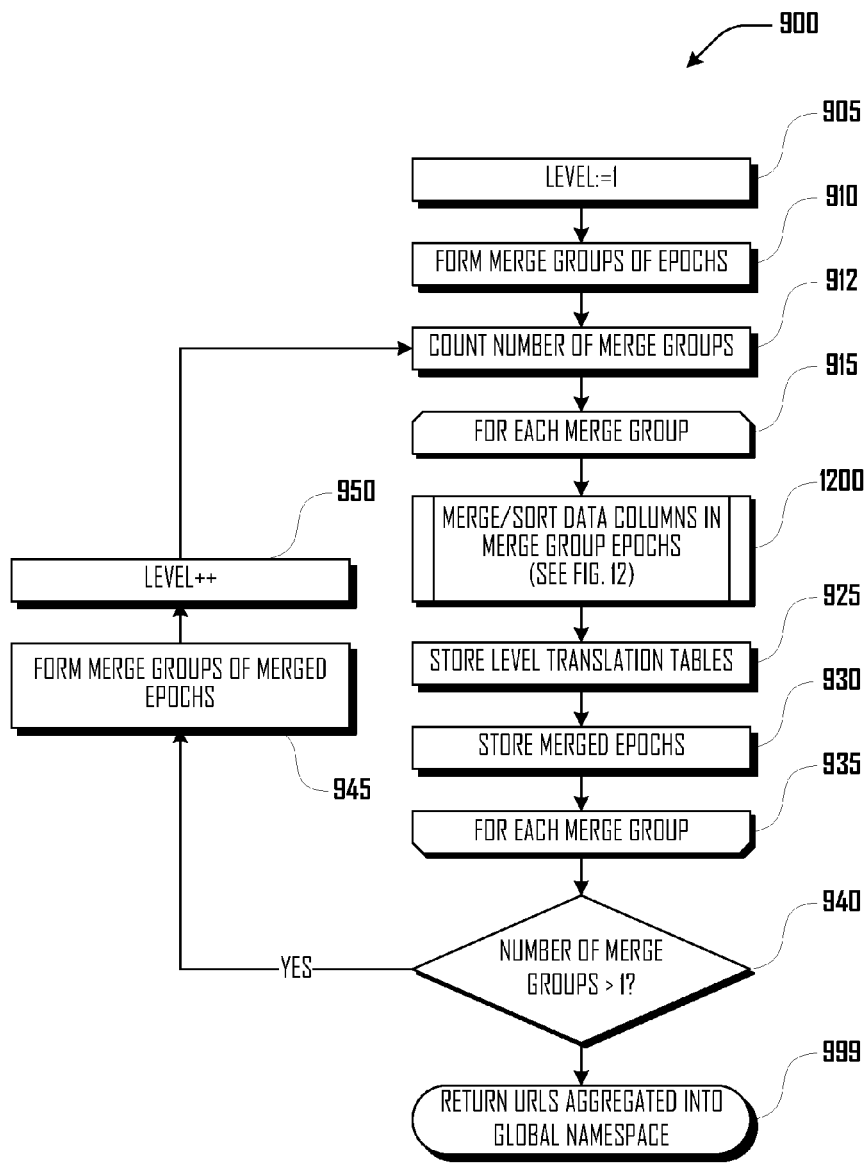
FIG. 9 is a flow diagram of an exemplary data aggregation subroutine in accordance with one embodiment.

FIG. 9 illustrates an exemplary data column aggregation subroutine 900. As previously discussed in reference to FIG. 6, data column aggregation subroutine 900 operates hierarchically on a plurality of separate epochs of data. In block 905, the current level of the hierarchy is initialized to a starting value. In an illustrative embodiment, the starting value is 1. As used herein, the term "level" in this context represents merely a convenient shorthand for conceptually distinguishing between various sets of merge groups and translation tables. In some embodiments, subroutine 900 may be implemented using a literal numeric counter. However, other embodiments may be implemented without explicitly initializing and/or incrementing a literal numeric counter (e.g., subroutine 900 may be implemented as a recursive, rather than iterative, process).

In step 910, epochs are grouped into merge groups comprising two or more epochs. In one embodiment, the size of merge groups is determined in accordance with an amount of data that can be stored in memory and/or processed on a single distributed computing device 200. In block 912, the number of merge groups is counted. In an exemplary embodiment, there may be several merge groups on low levels of the hierarchy, but only one merge group on the highest level.

Beginning in starting loop block 915, subroutine 900 processes each merge group. Although subroutine 900 depicts the exemplary process as iterative, in many embodiments, merge groups may be processed in parallel on multiple distributed computing devices 200. In subroutine 1200, one or more data columns in each epoch making up the merge group are merge/sorted (see FIG. 12 and associated text). In block 925, translation tables for the current level are created, one for each group member. In block 930, merged columns from the epochs in the current merge group are stored into an internally consistent namespace. (See items 615 in FIG. 6.) If there were two or more merge groups at the current level, the two or more sets of merged data will have colliding namespaces. From ending loop block 935, subroutine 900 loops back to block 915 to process the next merge group (if any).

After each merge group has been processed, in block 940, subroutine 900 determines whether the most recent count of merge groups (block 912) found more than one group. If there were two or more merge groups, then all columns of data have not yet been merged and sorted into a consistent namespace, as there are still at least two sets of merged columns with colliding namespaces. Therefore, subroutine 900 branches to block 945, where the most recently stored merged epochs are divided into new merge groups. At block 950, the level counter is incremented and processing returns to block 912.

If in block 940, subroutine 900 determines that the most recent count of merge groups (block 912) found only one group, then the most recently stored set of merged data (block 930) represents a unified set of data from all epochs, merged into a consistent namespace, and routine 900 returns the merged and sorted columns at block 999.

Figure 10:
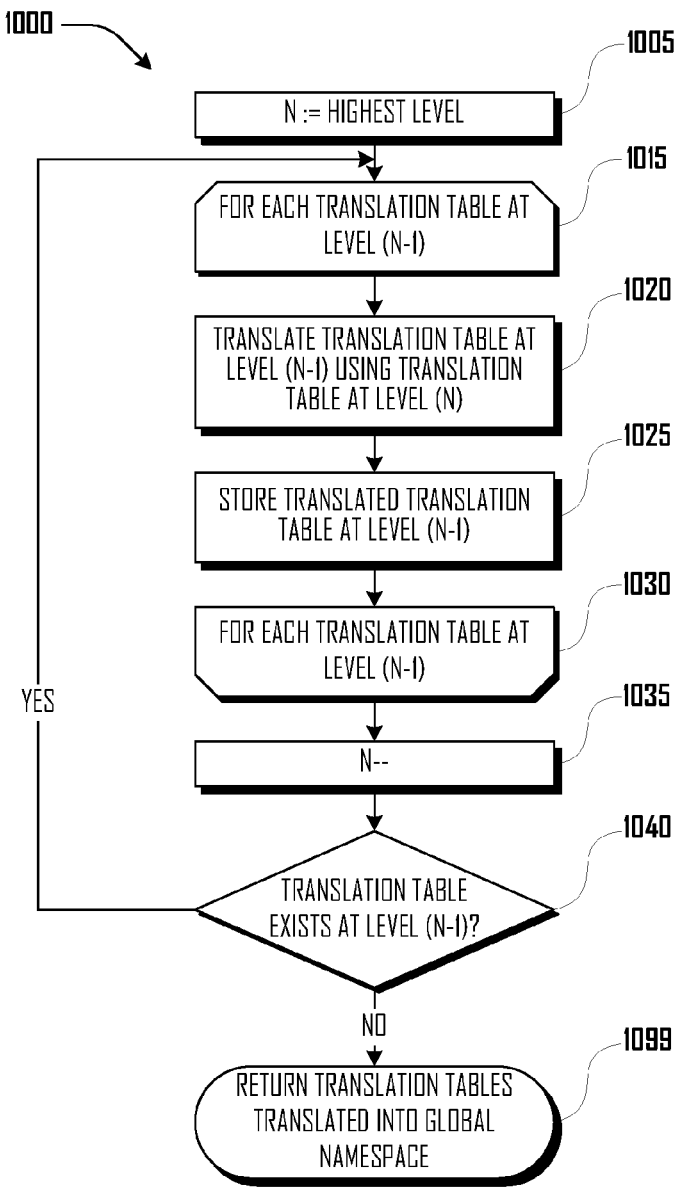
FIG. 10 is a flow diagram of an exemplary hierarchical breadcrumb translation subroutine in accordance with one embodiment.

FIG. 10 illustrates an exemplary translation table transformation (or translation) subroutine 1000. At block 1005, a level counter is initialized to the highest level reached in subroutine 900. Similar to this disclosure's use of the term "level" in the context of subroutine 900 (discussed above), subroutine 1000's "level counter" is merely a convenient shorthand for conceptually distinguishing between various sets of merge groups and translation tables. Various embodiments may be implemented with or without initializing and/or decrementing a literal numeric level counter.

Beginning in starting loop block 1010, translation tables from higher levels are applied to transform translation tables from the immediate lower level (if any). In some embodiments, higher and/or lower level translation tables may be distributed in ranges across more than one distributed computing device 200. In such embodiments, there may be additional "housekeeping" required to obtain and/or concatenate ranges from multiple devices into a single table. From starting loop block 1015 to ending loop block 1030, destination RIDs in each translation table at the next lower level are transformed or translated using the translation table at the current level. Although the exemplary process is depicted as iterative, in some embodiments, lower-level translation tables may be processed in parallel on one or more distributed computing devices. For example, a translation table at level one may indicate that source RID "1" becomes destination RID "2," and a translation table at level two may indicate that source RID "2" becomes destination RID "3." After the level 1 table is translated according to the level 2 table, the level 1 table would indicate that source RID "1" becomes destination RID "3." After each destination RID in the lower-level translation table is transformed (or translated) accordingly, the transformed lower-level translation table is stored. In some embodiments, the lower-level table may be overwritten. In other embodiments, a new lower-level translation table having transformed destination RIDs may be written.

After all lower-level translation tables are translated from blocks 1015-30, in block 1035, the level counter is decremented. If translation tables exist at the next lower level, then routine 1000 loops back to beginning loop block 1015 from ending loop block 1040. If not, then destination RIDs in all translation tables have been translated into the global namespace, and routine 1000 ends at 1099.

Figure 11:
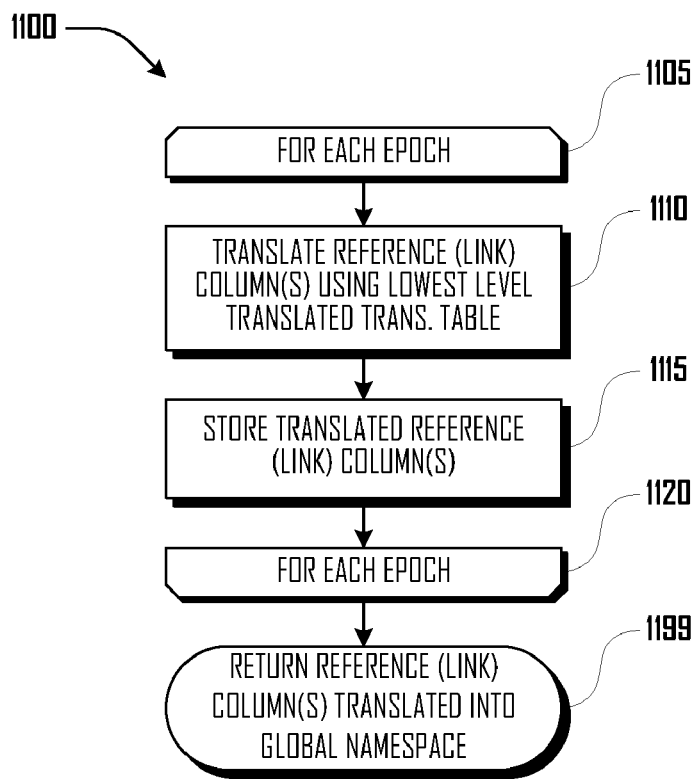
FIG. 11 is a flow diagram of an exemplary link translation subroutine in accordance with one embodiment.

FIG. 11 illustrates a flow diagram of an exemplary link column translation subroutine 1100. Beginning in starting loop block 1105, subroutine 1100 processes link columns in each epoch. Although the exemplary process is depicted as iterative, in some embodiments, epoch-level link columns may be translated into global namespace in parallel on one or more distributed computing devices. At block 1110, both the source RID and destination RID, of each record in all link columns, are translated according to the appropriate lowest-level global-namespace translation table. For example, an exemplary link column includes the following records: [1,2] [1,3] [2,3]. An exemplary translation table (after being transformed into the global namespace) includes the following records: [1,3], [2,4], [3,5]. Using the translation table to translate the exemplary link column into the global namespace would result in the following records: [3,4], [3,5], [4,5]. In block 1115, the translated link columns, which refer to RIDs in the global namespace, are stored. From ending loop block 1120, subroutine 1100 loops back to block 1105 to process the next epoch (if any). Once all link columns in all epochs have been processed, all link columns have been translated into the global namespace, and processing ends at block 1199.

Figure 12:
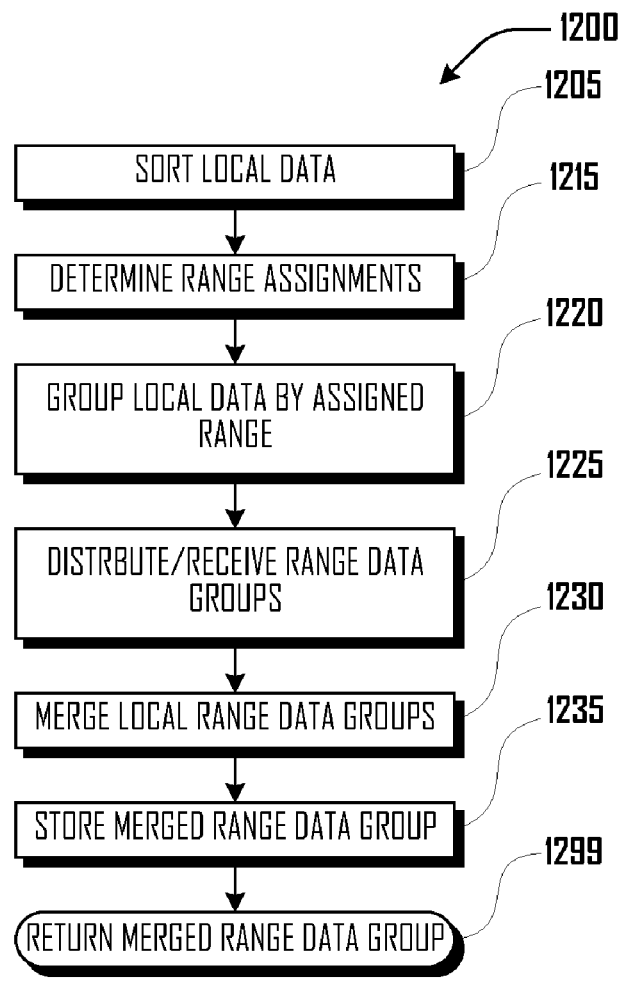
FIG. 12 is a flow diagram of an exemplary cluster sort subroutine in accordance with one embodiment.

FIG. 12 illustrates a flow diagram of an exemplary cluster merge/sort subroutine 1200. It is often true that serving web-scale data may be efficiently accomplished by dividing the entire dataset into sorted chunks, each of which is served by a different distributed computing device (or by multiple load balanced devices, or according to other load-distribution schemes).

By way of illustration, in an exemplary embodiment, columns of URLs may be sorted alphabetically, with an implicit or explicit RID attached to each entry. If such a data set were distributed across three computing devices, the first computing device might be responsible for serving entries beginning with A-I, the second might serve J-Q, and the third might serve R-Z. Thus, the exemplary cluster merge/sort subroutine 1200 not only sorts data, but also distributes data to the appropriate distributed computing device, while minimizing the amount of coordination required among the distributed computing devices.

Beginning in block 1205, a distributed computing device sorts local data. For example, after block 1205, a distributed computing device may have the following data set: [A, B, D, G, K, L, M, Q, Z]. In block 1215, the distributed computing device determines which range of data it will be assigned to serve. In one embodiment, the distributed computing device may determine its assignment by sampling local data, sharing the sampled data with one or more other distributed computing devices that are also participating in the cluster merge/sort operation, and determining range assignments in accordance with the sampled data. In other embodiments, each device may be assigned a pre-determined range. In still other embodiments, the device may determine a range in accordance with another method. After block 1215, for example, distributed computing device A may be assigned data range A-I; device B, J-P; and device C, Q-Z.

In block 1220, the distributed computing device groups its local data according to the ranges assigned to it and to other participating distributed computing devices. For example, the distributed computing device may divide its local data into three groups as follows: Range 1, [A, B, D, G]; Range 2, [K, L, M]; Range 3, [Q, Z]. In block 1225, the distributed computing device distributes one or more data groups to the appropriate other participating distributed computing device. In the illustrative example, the distributed computing device would retain range 1 group A, but would send range 2 and 3 data groups to other participating distributed computing devices. In turn, the distributed computing device would receive range 1 data groups from the other participating distributed computing devices. After block 1225, the distributed computing device has a local copy of all data in its assigned range (e.g., range 1). In block 1230, the distributed computing device merges its local data groups into a single column, and in block 1235, it stores the merged local data. The routine ends at block 1299.

Figure 13:
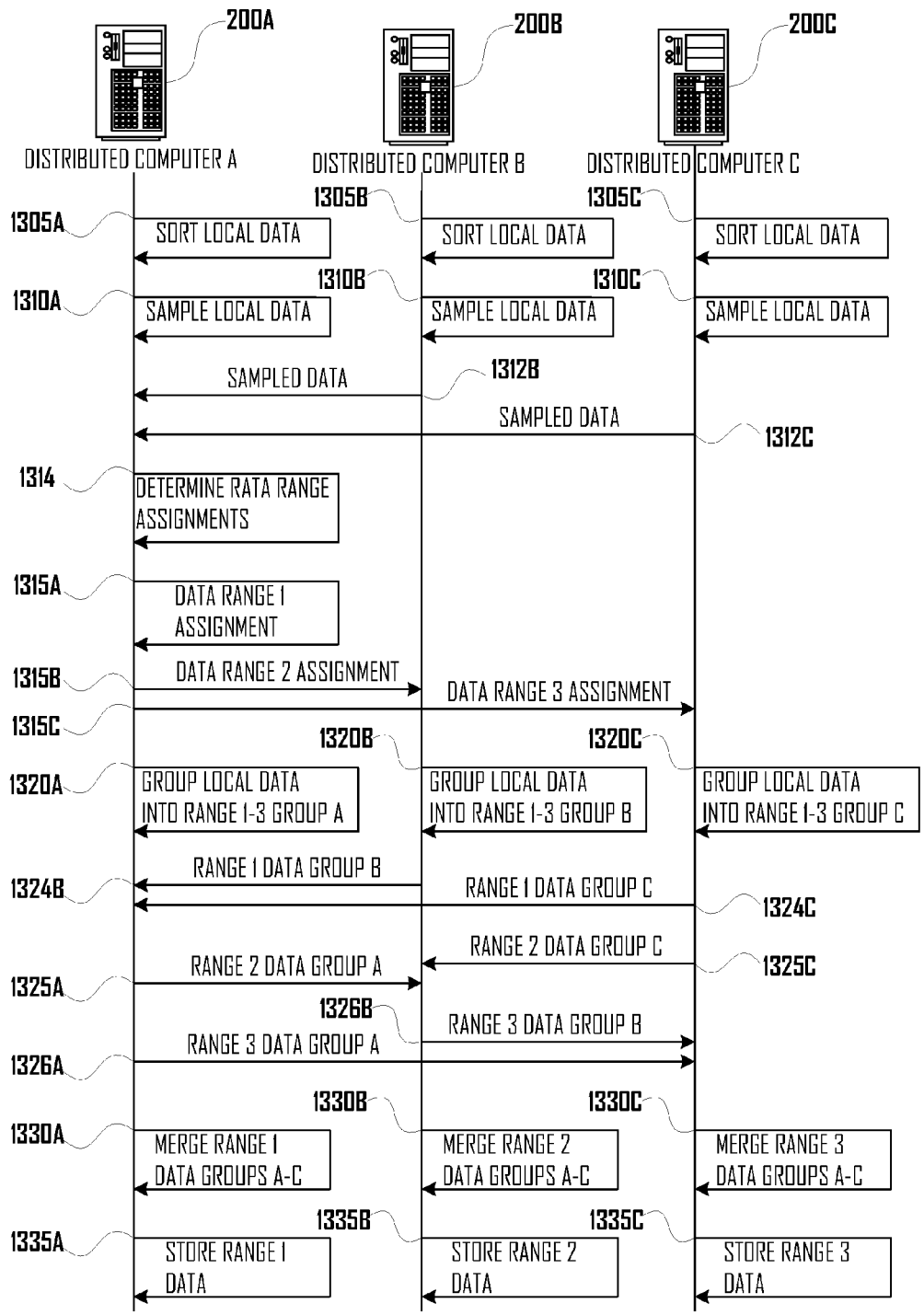
FIG. 13 is a data flow diagram of an exemplary cluster sort subroutine in accordance with one embodiment.

FIG. 13 illustrates a data flow diagram of one possible implementation of a distributed merge/sort subroutine 1200. In the illustrated exemplary implementation, each participating distributed computing device 200A-C begins with a local data set that is distributed across a spectrum (e.g., from A-Z), including data that should be assigned to one of the other participating distributed computing devices. Although three computing devices are illustrated, in some embodiments, more or fewer computing devices may be present. In other embodiments, there may be only a single computing device.

Each participating distributed computing device 200A-C sorts 1305A-C local data. For example, after local sorting, distributed computing device 200A may have the following data set: [A, B, D, G, K, L, M, Q, Z]. Participating distributed computing devices 200A-C then assign data ranges among themselves. In one embodiment, participating distributed computing device 200A-C assign ranges by sampling 1310A-C local data, sharing 1312B-C the sampled data with a designated (or selected, determined, or the like) one of the participating distributed computing devices 200A. The designated device 200A determines 1314 data range assignments in accordance with the sampled data. The designated distributed computing device 200A distributes 1315A-C data range assignments to the other participating distributed computing devices 200B-C. For example, distributed computing device A may be assigned A-I; device B, J-P; and device C, Q-Z.

Participating distributed computing devices 200A-C each group 1320A-C their respective local data according to their assigned ranges. For example, distributed computing device A may group its data into Range 1 [A, B, D, G], Range 2 [K, L, M], and Range 3 [Q, Z]. Distributed computing devices 200A-C then distribute 1324-26 data groups to their respective assigned computing device. For example, distributed computing device 200A would retain range 1 group A, but would send 1325A range 2 group A to distributed computing device 200B, and would send 1326A range 3 data group A to distributed computing device 200C. In turn, distributed computing device 200A would receive 1324B range 1 data group B from distributed computing devices 200B, and would receive 1324C range 1 data group C from distributed computing devices 200C. Similarly, distributed computing device 200A sends 1325A range 2 data group A to distributed computing device 200B, and distributed computing device 200C sends 1325C range 2 data group C to distributed computing device 200B. At this point, each participating distributed computing device 200A-C has a local copy of all data in its assigned range. Distributed computing devices 200A-C merge 1330A-C their local data groups into a single column, and store 1335A-C their merged local data.

In some embodiments, distributed merge/sort subroutine 1200 may operate on translation table data. In such embodiments, merged local data columns may be re-distributed and concatenated together to serve as a top-level translation table, which may be used to propagate translations to other data sets.

In one embodiment, once data is sorted and distributed across participating distributed computing device 200A-C, each column of data may be indexed by creating much smaller (e.g., 64 kilobyte) chunks that can still be compressed. A clustered index may be built on the first record in each of these chunks. Queries for specific records may first hit the chunk index. Once the relevant chunk is identified, it may be scanned for matching records. This technique may be well-suited to sorted index scans and sorted merge joins. In one embodiment, all request logic may be cast as sorted index scans and sorted merge joins.

In one embodiment, communication and data transfer between distributed computing devices may be implemented according to a remote execution protocol such as Secure Shell ("SSH") or JSON Shell (short for JavaScript Object Notation, a lightweight computer data interchange format).

In some embodiments, data may be compressed according to any of several well-known algorithms (e.g., Lempel-Zev implementations such as lzo, and gz, or other types of lossless encoding, such as Huffman, Arithmetic, Golomb, run-length encoding, and the like). In some embodiments, data may also be compressed according to gap encoding schemes tailored for links (i.e., runs of pairs of monotonic increasing integers according to a fixed pattern), run-length encoding schemes also tailored for links (i.e., runs of pairs of sequentially incrementing integers according to a fixed pattern), and/or variable length integer encoding schemes.

Although specific embodiments have been illustrated and described herein, it will be appreciated by those of ordinary skill in the art that a whole variety of alternate and/or equivalent implementations may be substituted for the specific embodiments shown and described without departing from the scope of the present disclosure. This application is intended to cover any adaptations or variations of the embodiments discussed herein.

The invention claimed is:

1. A method executing on at least one computing system for merging records from a plurality of conflicting namespaces into a globally-unified namespace, the method comprising:
performing steps a-d for an initial iteration level; and
performing at least steps a-c for a next iteration level:
 a. obtaining a first plurality of source columns associated with a current iteration level, each source column including a plurality of records with source-column-unique, but not first-plurality-unique, identifiers;
 b. grouping said first plurality of source columns into a current merge-group set comprising at least two merge groups for said initial iteration level and at least one merge group for said next iteration level, each merge group including at least two source columns;
 c. for each merge group in said current merge-group set:
  i. sorting and merging records from said at least two source columns in the current merge group into a merged column having a plurality of records with merged-column-unique identifiers;
  ii. storing the current merged column; and
  iii. for each of said at least two source columns in the current merge group, creating a translation table associated with the current iteration-level identifier, said translation table comprising a source entry for each source-column-unique record identifier in the current source column and a destination entry for each corresponding merged-column-unique record identifier in the current merged column;
 d. associating the at least two current merged columns with said next iteration level.

2. The method of claim 1, further comprising:
obtaining a first translation table associated with said next iteration level;
obtaining a second translation table associated with said initial iteration level;
iteratively translating destination entries in said second translation table according to corresponding destination entries in said first translation table; and
storing the translated second translation table in association with said initial iteration level.

3. The method of claim 2, wherein iteratively translating destination entries in said second translation table according to corresponding destination entries in said first translation table comprises:
for each second-translation-table source entry:
 identifying a second-translation-table destination entry corresponding to the current second-translation-table source entry;
 identifying a first-translation-table source entry corresponding to the identified second-translation-table destination entry;
 identifying a first-translation-table destination entry corresponding to the identified first-translation-table source entry; and
 replacing said second-translation-table destination entry with the identified first-translation-table destination entry.

4. The method of claim 2, further comprising:
obtaining a link column associated with one of said first plurality of source columns associated with said initial iteration level, wherein said link column comprises a plurality of link records, each link record referencing a pair of source-column-unique record identifiers associated with said one of said first plurality of source columns;
obtaining said translated second translation table associated with said initial iteration level;
iteratively translating said plurality of link records in said link column according to said translated second translation table; and
storing the translated link column in association with said initial iteration level.

5. The method of claim 4, wherein iteratively translating said plurality of link records in said link column according to said translated second translation table comprises:
for each source-column-unique record identifier referenced in each of said plurality of link records:

identifying a translated-second-translation-table source entry corresponding to the current source-column-unique record identifier;

identifying a translated-second-translation-table destination entry corresponding to the identified translated-second-translation-table source entry; and replacing the current source-column-unique record identifier with the identified translated-second-translation-table destination entry.

6. The method of claim 4, further comprising:

obtaining a plurality of said translated link columns associated with said initial iteration level; and sorting and merging link records from said plurality of said translated link columns into a merged link column.

7. The method of claim 1, wherein sorting and merging records from said at least two source columns in the current merge group into a merged column having a plurality of records with merged-column-unique identifiers comprises:

sorting, by a first computing device, a first plurality of records corresponding to a first one of said at least two source columns;

determining a plurality of exclusive data ranges, including at least a first data range that corresponds to a first subset of said sorted first plurality of records and a second data range that corresponds to a second subset of said sorted first plurality of records; and providing, to a remote computing device, said second subset of said sorted first plurality of records corresponding to said second data range;

obtaining, from said remote computing device, a third subset of a sorted second plurality of records corresponding to said first data range, said sorted second plurality of records corresponding to a second one of said at least two source columns;

merging said first subset of said sorted first plurality of records and said third subset of said sorted second plurality of records into a merged and sorted plurality of records corresponding to said first data range; and storing said merged and sorted plurality of records by said first computing device.

8. A computing apparatus comprising a processor and a memory, the memory storing instructions that, when executed by the processor, perform a method for merging records from a plurality of conflicting namespaces into a globally-unified namespace, the method comprising:

performing steps a-d for an initial iteration level; and
performing at least steps a-c for a next iteration level:

a. obtaining a first plurality of source columns associated with a current iteration level, each source column including a plurality of records with source-column-unique, but not first-plurality-unique, identifiers;

b. grouping said first plurality of source columns into a current merge-group set comprising at least two merge groups for said initial iteration level and at least one merge group for said next iteration level, each merge group including at least two source columns;

c. for each merge group in said current merge-group set:
  i. sorting and merging records from said at least two source columns in the current merge group into a merged column having a plurality of records with merged-column-unique identifiers;
  ii. storing the current merged column; and
  iii. for each of said at least two source columns in the current merge group, creating a translation table associated with the current iteration-level identifier, said translation table comprising a source entry for each source-column-unique record identifier in the current source column and a destination entry for each corresponding merged-column-unique record identifier in the current merged column;

d. associating the at least two current merged columns with said next iteration level.

9. The method of claim 8, the method further comprising:

obtaining a first translation table associated with said next iteration level;

obtaining a second translation table associated with said initial iteration level;

iteratively translating destination entries in said second translation table according to corresponding destination entries in said first translation table; and storing the translated second translation table in association with said initial iteration level.

10. The computing apparatus of claim 9, wherein iteratively translating destination entries in said second translation table according to corresponding destination entries in said first translation table comprises:

for each second-translation-table source entry:
  identifying a second-translation-table destination entry corresponding to the current second-translation-table source entry;
  identifying a first-translation-table source entry corresponding to the identified second-translation-table destination entry;
  identifying a first-translation-table destination entry corresponding to the identified first-translation-table source entry; and
  replacing said second-translation-table destination entry with the identified first-translation-table destination entry.

11. The computing apparatus of claim 9, the method further comprising:

obtaining a link column associated with one of said first plurality of source columns associated with said initial iteration level, wherein said link column comprises a plurality of link records, each link record referencing a pair of source-column-unique record identifiers associated with said one of said first plurality of source columns;

obtaining said translated second translation table associated with said initial iteration level;

iteratively translating said plurality of link records in said link column according to said translated second translation table; and storing the translated link column in association with said initial iteration level.

12. The computing apparatus of claim 11, wherein iteratively translating said plurality of link records in said link column according to said translated second translation table comprises:

for each source-column-unique record identifier referenced in each of said plurality of link records:
  identifying a translated-second-translation-table source entry corresponding to the current source-column-unique record identifier;
  identifying a translated-second-translation-table destination entry corresponding to the identified translated-second-translation-table source entry; and
  replacing the current source-column-unique record identifier with the identified translated-second-translation-table destination entry.

13. The computing apparatus of claim 11, the method further comprising:

obtaining a plurality of said translated link columns associated with said initial iteration level; and sorting and merging link records from said plurality of said translated link columns into a merged link column.

14. The computing apparatus of claim 8, wherein sorting and merging records from said at least two source columns in the current merge group into a merged column having a plurality of records with merged-column-unique identifiers comprises:
sorting, by the computing apparatus, a first plurality of records corresponding to a first one of said at least two source columns;
determining a plurality of exclusive data ranges, including at least a first data range that corresponds to a first subset of said sorted first plurality of records and a second data range that corresponds to a second subset of said sorted first plurality of records; and
providing, to a remote computing device, said second subset of said sorted first plurality of records corresponding to said second data range;
obtaining, from said remote computing device, a third subset of a sorted second plurality of records corresponding to said first data range, said sorted second plurality of records corresponding to a second one of said at least two source columns;
merging said first subset of said sorted first plurality of records and said third subset of said sorted second plurality of records into a merged and sorted plurality of records corresponding to said first data range;
storing said merged and sorted plurality of records by the computing apparatus.

15. A computer-readable storage medium having stored thereon instructions that, when executed by at least one processor, perform a method for merging records from a plurality of conflicting namespaces into a globally-unified namespace, the method comprising:
performing steps a-d for an initial iteration level; and
performing at least steps a-c for a next iteration level:
a. obtaining a first plurality of source columns associated with a current iteration level, each source column including a plurality of records with source-column-unique, but not first-plurality-unique, identifiers;
b. grouping said first plurality of source columns into a current merge-group set comprising at least two merge groups for said initial iteration level and at least one merge group for said next iteration level, each merge group including at least two source columns;
c. for each merge group in said current merge-group set:
 i. sorting and merging records from said at least two source columns in the current merge group into a merged column having a plurality of records with merged-column-unique identifiers;
 ii. storing the current merged column; and
 iii. for each of said at least two source columns in the current merge group, creating a translation table associated with the current iteration-level identifier, said translation table comprising a source entry for each source-column-unique record identifier in the current source column and a destination entry for each corresponding merged-column-unique record identifier in the current merged column;
d. associating the at least two current merged columns with said next iteration level.

16. The storage medium of claim 15, the method further comprising:
obtaining a first translation table associated with said next iteration level;
obtaining a second translation table associated with said initial iteration level;
iteratively translating destination entries in said second translation table according to corresponding destination entries in said first translation table; and
storing the translated second translation table in association with said initial iteration level.

17. The storage medium of claim 16, wherein iteratively translating destination entries in said second translation table according to corresponding destination entries in said first translation table comprises:
for each second-translation-table source entry:
identifying a second-translation-table destination entry corresponding to the current second-translation-table source entry;
identifying a first-translation-table source entry corresponding to the identified second-translation-table destination entry;
identifying a first-translation-table destination entry corresponding to the identified first-translation-table source entry; and
replacing said second-translation-table destination entry with the identified first-translation-table destination entry.

18. The storage medium of claim 16, the method further comprising:
obtaining a link column associated with one of said first plurality of source columns associated with said initial iteration level, wherein said link column comprises a plurality of link records, each link record referencing a pair of source-column-unique record identifiers associated with said one of said first plurality of source columns;
obtaining said translated second translation table associated with said initial iteration level;
iteratively translating said plurality of link records in said link column according to said translated second translation table; and
storing the translated link column in association with said initial iteration level.

19. The storage medium of claim 18, wherein iteratively translating said plurality of link records in said link column according to said translated second translation table comprises:
for each source-column-unique record identifier referenced in each of said plurality of link records:
identifying a translated-second-translation-table source entry corresponding to the current source-column-unique record identifier;
identifying a translated-second-translation-table destination entry corresponding to the identified translated-second-translation-table source entry; and
replacing the current source-column-unique record identifier with the identified translated-second-translation-table destination entry.

20. The storage medium of claim 18, the method further comprising:
obtaining a plurality of said translated link columns associated with said initial iteration level; and
sorting and merging link records from said plurality of said translated link columns into a merged link column.

21. The storage medium of claim 15, wherein sorting and merging records from said at least two source columns in the current merge group into a merged column having a plurality of records with merged-column-unique identifiers comprises:
sorting, by a first computing device, a first plurality of records corresponding to a first one of said at least two source columns;

determining a plurality of exclusive data ranges, including at least a first data range that corresponds to a first subset of said sorted first plurality of records and a second data range that corresponds to a second subset of said sorted first plurality of records; and providing, to a remote computing device, said second subset of said sorted first plurality of records corresponding to said second data range;

obtaining, from said remote computing device, a third subset of a sorted second plurality of records corresponding to said first data range, said sorted second plurality of records corresponding to a second one of said at least two source columns;

merging said first subset of said sorted first plurality of records and said third subset of said sorted second plurality of records into a merged and sorted plurality of records corresponding to said first data range;

storing said merged and sorted plurality of records by the first computing device.

* * * * *